United States Patent
Kudekar et al.

(10) Patent No.: US 10,511,328 B2
(45) Date of Patent: Dec. 17, 2019

(54) EFFICIENT LIST DECODING OF LDPC CODES

(71) Applicant: QUALCOMM Incorporated, San Diego, CA (US)

(72) Inventors: Shrinivas Kudekar, Raritan, NJ (US); Thomas Joseph Richardson, South Orange, NJ (US); Gabi Sarkis, San Diego, CA (US); Vincent Loncke, Piscataway, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 117 days.

(21) Appl. No.: 15/802,163

(22) Filed: Nov. 2, 2017

(65) Prior Publication Data
US 2018/0131391 A1    May 10, 2018

Related U.S. Application Data

(60) Provisional application No. 62/417,754, filed on Nov. 4, 2016.

(51) Int. Cl.
| | |
|---|---|
| *H03M 13/11* | (2006.01) |
| *H04L 1/00* | (2006.01) |
| *H03M 13/29* | (2006.01) |
| *H03M 13/37* | (2006.01) |
| *H03M 13/45* | (2006.01) |

(Continued)

(52) U.S. Cl.
CPC .... *H03M 13/1125* (2013.01); *H03M 13/1111* (2013.01); *H03M 13/2906* (2013.01); *H03M 13/3707* (2013.01); *H03M 13/3723* (2013.01); *H03M 13/451* (2013.01); *H03M 13/6306* (2013.01); *H03M 13/6393* (2013.01); *H03M 13/6561* (2013.01); *H04L 1/0045* (2013.01); *H03M 13/09* (2013.01); *H03M 13/116* (2013.01); *H03M 13/1128* (2013.01); *H03M 13/1185* (2013.01); *H04L 1/0009* (2013.01)

(58) Field of Classification Search
CPC ......... H03M 13/1125; H03M 13/3707; H03M 13/6561; H03M 13/6393; H03M 13/6306; H03M 13/451; H03M 13/3723; H03M 13/1111; H03M 13/2906; H03M 13/1185; H03M 13/116; H03M 13/1128; H03M 13/09; H04L 1/0045; H04L 1/0009

See application file for complete search history.

(56) References Cited

U.S. PATENT DOCUMENTS

| | | |
|---|---|---|
| 6,633,865 B1 | 10/2003 | Liao |
| 6,961,888 B2 | 11/2005 | Jin et al. |
| 7,133,853 B2 | 11/2006 | Richardson et al. |

(Continued)

OTHER PUBLICATIONS

Mackay D.J.C., "Good Error-Correcting Codes Based on Very Sparse Matrices," IEEE Transactions on Information Theory, Mar. 1999, vol. 45 (2), pp. 399-431.

(Continued)

*Primary Examiner* — Thien Nguyen
(74) *Attorney, Agent, or Firm* — Patterson & Sheridan, LLP

(57) ABSTRACT

Certain aspects of the present disclosure generally relate to methods and apparatus for decoding low density parity check (LDPC) codes, and more particularly to an efficient list decoder for list decoding low density parity check (LDPC) codes.

32 Claims, 8 Drawing Sheets

(51) Int. Cl.
   *H03M 13/00*   (2006.01)
   *H03M 13/09*   (2006.01)

(56) References Cited

U.S. PATENT DOCUMENTS

| | | | |
|---|---|---|---|
| 7,552,097 B2 | 6/2009 | Richardson et al. | |
| 7,627,801 B2 | 12/2009 | Jin et al. | |
| 8,751,902 B2 | 6/2014 | Jin et al. | |
| 2006/0190799 A1* | 8/2006 | Kan | H03M 13/1191 714/758 |
| 2008/0301518 A1* | 12/2008 | Miyazaki | H03M 13/116 714/752 |
| 2012/0195398 A1* | 8/2012 | Shen | H03M 13/2957 375/340 |
| 2012/0287973 A1* | 11/2012 | Shen | H03M 13/2957 375/219 |
| 2014/0169412 A1* | 6/2014 | Baligh | H04B 1/709 375/150 |
| 2014/0177762 A1* | 6/2014 | Gotman | H04L 27/0008 375/340 |
| 2014/0177765 A1* | 6/2014 | Gotman | H04L 1/005 375/346 |
| 2017/0126360 A1* | 5/2017 | Millar | H04L 1/0045 |

OTHER PUBLICATIONS

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

International Search Report and Written Opinion—PCT/US2017/059835—ISA/EPO—dated Jul. 16, 2018.

Marc Fossorier P.C., "Iterative Reliability-Based Decoding of Low-Density Parity Check Codes," IEEE Journal on Selected Areas in Communications, May 1, 2001, vol. 19 (5), XP011055370, pp. 908-917.

Nedeljko V., et al., "Augmented Belief Propagation Decoding of Low-Density Parity Check Codes," IEEE Transactions on Communications, Jul. 1, 2007, vol. 55 (7), pp. 1308-1317, XP011187493.

Schlafer P., et al., "A New LDPC Decoder Hardware Implementation with Improved Error Rates," IEEE Jordan Conference on Applied Electrical Engineering and Computing Technologies (AEECT), Nov. 3, 2015, XP032834770, pp. 1-6, [retrieved on Dec. 17, 2015].

Scholl S., et al., "Advanced Iterative Channel Coding Schemes: When Shannon Meets Moore," Proceedings of 9th International Symposium on Turbo Codes and Iterative Information Processing, ISTC, Sep. 5, 2016, pp. 406-411, XP032981334, [retrieved on Oct. 17, 2016].

Scholl S., et al., "Saturated min-sum Decoding: An Afterburner for LDPC Decoder Hardware," Proceedings of Design, Automation & Test in Europe Conference & Exhibition (DATE), EDAA, Mar. 14, 2016, pp. 1219-1224, XP032895118, [retrieved on Apr. 25, 2016].

* cited by examiner

EFFICIENT LIST DECODING OF LDPC CODES

CROSS-REFERENCE TO RELATED APPLICATIONS

This application claims the benefit of U.S. Provisional Patent No. 62/417,754, filed Nov. 4, 2016. The content of the provisional application is hereby incorporated by reference in its entirety.

BACKGROUND

Technical Field

Certain aspects of the present disclosure generally relate to methods and apparatus for wireless communications, and more particularly to an efficient list decoder for list decoding low density parity check (LDPC) codes.

Introduction

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Long Term Evolution (LTE) systems, Code Division Multiple Access (CDMA) systems, Time Division Multiple Access (TDMA) systems, Frequency Division Multiple Access (FDMA) systems, $3^{rd}$ Generation Partnership Project (3GPP) Long Term Evolution (LTE) systems, Long Term Evolution Advanced (LTE-A) systems, and Orthogonal Frequency Division Multiple Access (OFDMA) systems.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a one may be changed to a zero or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a one or a zero) together with some indication of the reliability of that estimate. While the number of errors may be relatively low, even a small number of errors or level of distortion can result in the data being unusable or, in the case of transmission errors, may necessitate retransmission of the data.

In order to provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

With the increased use of fiber optic lines for data communication and increases in the rate at which data can be read from and stored to data storage devices, (e.g., disk drives, tapes, etc.), there is an increasing need not only for efficient use of data storage and transmission capacity but also for the ability to encode and decode data at high rates of speed.

While encoding efficiency and high data rates are important, for an encoding and/or decoding system to be practical for use in a wide range of devices (e.g., consumer devices), it is important that the encoders and/or decoders be capable of being implemented at reasonable cost.

Communication systems often need to operate at several different rates. One way to keep the implementation as simple as possible and to provide for the coding and decoding at the different rates is to use adjustable low-density-parity check (LDPC) codes. In particular, one can generate higher-rate LDPC codes by puncturing lower-rate codes.

These multiple access technologies have been adopted in various telecommunication standards to provide a common protocol that enables different wireless devices to communicate on a municipal, national, regional, and even global level. An example of an emerging telecommunication standard is new radio (NR). NR is a set of enhancements to the LTE mobile standard (e.g., 5G radio access) promulgated by Third Generation Partnership Project (3GPP). NR is designed to better support mobile broadband Internet access by improving spectral efficiency, lower costs, improve services, make use of new spectrum, and better integrate with other open standards using OFDMA with a cyclic prefix (CP) on the downlink (DL) and on the uplink (UL) as well as support beamforming, multiple-input multiple-output (MIMO) antenna technology, and carrier aggregation.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

BRIEF SUMMARY

The systems, methods, and devices of the disclosure each have several aspects, no single one of which is solely responsible for its desirable attributes. Without limiting the scope of this disclosure as expressed by the claims, which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure present a method for performing low-density parity-check (LDPC) decoding. The method generally includes receiving a plurality of log-likelihood ratios (LLRs) corresponding to bits of a code word. The method further includes selecting one or more parity bits to extend the code word. The method further includes generating a plurality of sets of LLRs corresponding to all possible combinations of values for the one or more parity bits, each of the plurality of sets of LLRs including the plurality of LLRs corresponding to the bits of the code word. The method further includes decoding each of the plurality of sets of LLRs to generate a corresponding plurality of candidate messages. The method further includes selecting one of the plurality of candidate messages as corresponding to the code word based on a parameter of each of the plurality of candidate messages.

Certain aspects of the present disclosure present an apparatus for performing low-density parity-check (LDPC) decoding. The apparatus generally includes means for receiving a plurality of log-likelihood ratios (LLRs) corresponding to bits of a code word. The apparatus further includes means for selecting one or more parity bits to extend the code word. The apparatus further includes means for generating a plurality of sets of LLRs corresponding to all possible combinations of values for the one or more parity bits, each of the plurality of sets of LLRs including the plurality of LLRs corresponding to the bits of the code word. The apparatus further includes means for decoding each of the plurality of sets of LLRs to generate a corresponding plurality of candidate messages. The apparatus further includes means for selecting one of the plurality of candidate messages as corresponding to the code word based on a parameter of each of the plurality of candidate messages.

Certain aspects of the present disclosure present an apparatus for performing low-density parity-check (LDPC) decoding. The apparatus generally includes a memory and a processor. The memory and the processor are generally configured to receive a plurality of log-likelihood ratios (LLRs) corresponding to bits of a code word. The memory and the processor are further configured to select one or more parity bits to extend the code word. The memory and the processor are further configured to generate a plurality of sets of LLRs corresponding to all possible combinations of values for the one or more parity bits, each of the plurality of sets of LLRs including the plurality of LLRs corresponding to the bits of the code word. The memory and the processor are further configured to decode each of the plurality of sets of LLRs to generate a corresponding plurality of candidate messages. The memory and the processor are further configured to select one of the plurality of candidate messages as corresponding to the code word based on a parameter of each of the plurality of candidate messages.

Certain aspects of the present disclosure present a non-transitory computer-readable medium having instructions stored thereon for performing a method for low-density parity-check (LDPC) decoding. The method generally includes receiving a plurality of log-likelihood ratios (LLRs) corresponding to bits of a code word. The method further includes selecting one or more parity bits to extend the code word. The method further includes generating a plurality of sets of LLRs corresponding to all possible combinations of values for the one or more parity bits, each of the plurality of sets of LLRs including the plurality of LLRs corresponding to the bits of the code word. The method further includes decoding each of the plurality of sets of LLRs to generate a corresponding plurality of candidate messages. The method further includes selecting one of the plurality of candidate messages as corresponding to the code word based on a parameter of each of the plurality of candidate messages.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
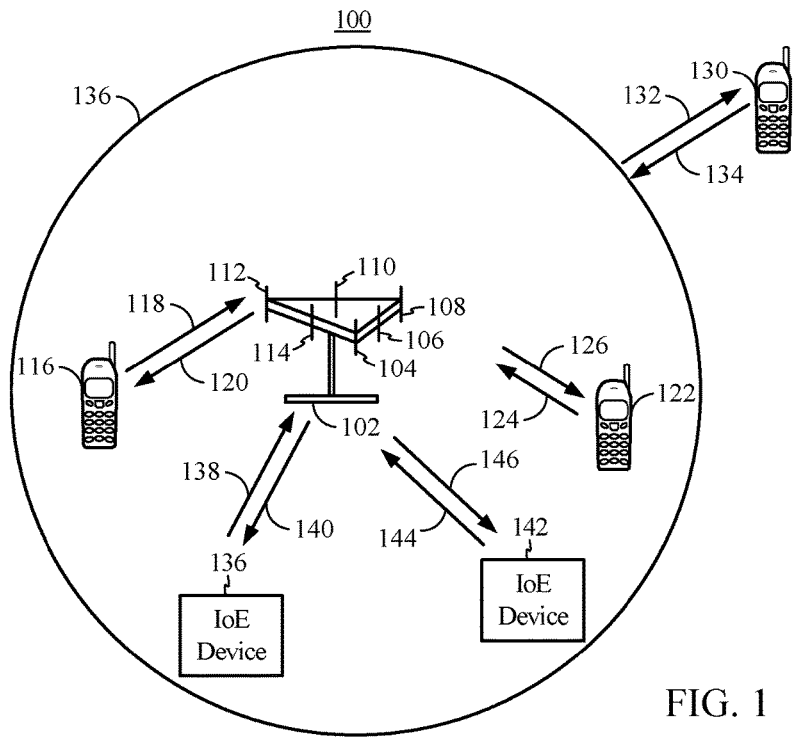
FIG. 1 illustrates an example communications network, according to certain aspects of the present disclosure.

Aspects of the present disclosure provide apparatus, methods, processing systems, and computer program products for encoding for new radio (NR) (new radio access technology). New radio (NR) may refer to radios configured to operate according to a new air interface or fixed transport layer. NR may include Enhanced mobile broadband (eMBB) targeting wide bandwidth (e.g. 80 MHz or beyond), millimeter wave (mmW) targeting high carrier frequency (e.g. 27 GHz or beyond), massive MTC (mMTC) targeting non-backward compatible MTC techniques, and mission critical targeting ultra reliable low latency communications (URLLC). For these general topics, different techniques are considered, such as coding, low-density parity check (LDPC), and polar. NR cell may refer to a cell operating according to the new air interface or fixed transport layer. A NR Node B (e.g., 5G Node B) may correspond to one or multiple transmission reception points (TRPs).

Certain aspects of the present disclosure generally relate to methods and apparatus for decoding low density parity check (LDPC) codes, and more particularly to an efficient list decoder for list decoding LDPC codes.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Long Term Evolution (LTE), Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as NR (e.g., 5G RA), Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). NR is an emerging wireless communications technology under development in conjunction with the 5G Technology Forum (5GTF). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn great attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Node B (e.g., 5G Node B), transmission reception point (TRP), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), medical devices or equipment, biometric sensors/devices, an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link.

While aspects may be described herein using terminology commonly associated with 3G and/or 4G wireless technologies, aspects of the present disclosure can be applied in other generation-based communication systems, such as 5G and later, including NR technologies.

An Example Wireless Communication System

FIG. 1 illustrates an example communications network 100 in which aspects of the present disclosure may be performed. As illustrated, a Node B 102 (e.g., a TRP or 5G Node B) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Wireless node 116 may be in communication with antennas 112 and 114, where antennas 112 and 114 transmit information to wireless node 116 over forward link 120 and receive information from wireless node 116 over reverse link 118. Wireless node 122 may be in communication with antennas 106 and 108, where antennas 106 and 108 transmit information to wireless node 122 over forward link 126 and receive information from wireless node 122 over reverse link 124. The Node B 102 may also be in communication with other wireless nodes, which may be, for example, Internet-of-Everything (IoE) devices. IoE device 136 may be in communication with one or more other antennas of Node B 102, where the antennas transmit information to IoE device 136 over forward link 140 and receive information from IoE device 136 over reverse link 138. IoE device 142 may be in communication with one or more other antennas of Node B 102, where the antennas transmit information to IoE device 142 over forward link 146 and receive information from IoE device 142 over reverse link 144. In a Frequency Division Duplex (FDD) system, communication links 118, 120, 124, 126, 138, 140, 144, and 146 may use different frequency for communication. For example, forward link 120 may use a different frequency than that used by reverse link 118, and forward link 140 may use a different frequency than that used by reverse link 138.

Each group of antennas and/or the area in which they are designed to communicate is often referred to as a sector of the Node B. In one aspect of the present disclosure, each antenna group may be designed to communicate to wireless nodes in a sector of the areas covered by Node B 102.

Wireless node 130 may be in communication with Node B 102, where antennas from the Node B 102 transmit information to wireless node 130 over forward link 132 and receive information from the wireless node 130 over reverse link 134.

In communication over forward links 120 and 126, the transmitting antennas of BS 102 may utilize beamforming in order to improve the signal-to-noise ratio of forward links for the different wireless nodes 116, 122, 136, and 142. Also, a Node B using beamforming to transmit to wireless nodes scattered randomly through its coverage causes less interference to wireless nodes in neighboring cells than a Node B transmitting through a single antenna to all its wireless nodes.

While aspects of the examples described herein may be associated with LTE technologies, aspects of the present disclosure may be applicable with other wireless communications systems, such as NR. NR may utilize orthogonal frequency-division multiplexing (OFDM) with a CP on the uplink and downlink and include support for half-duplex operation using time division duplex (TDD). A single component carrier bandwidth of 100 MHZ may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., downlink (DL) or uplink (UL)) for data transmission and the link direction for each subframe may be dynamically switched. Each subframe may include DL/UL data as well as DL/UL control data. Beamforming may be supported and beam direction may be dynamically configured. MIMO transmissions with precoding may also be supported. MIMO configurations in the DL may support up to 8 transmit antennas with multi-layer DL transmissions with up to 8 streams. Multi-layer transmissions with up to 2 streams per UE may be supported. Aggregation of multiple cells may be supported with up to 8 serving cells. Alternatively, NR may support a different air interface, other than an OFDM-based air interface. NR networks may include entities such central units or distributed units.

Figure 2:
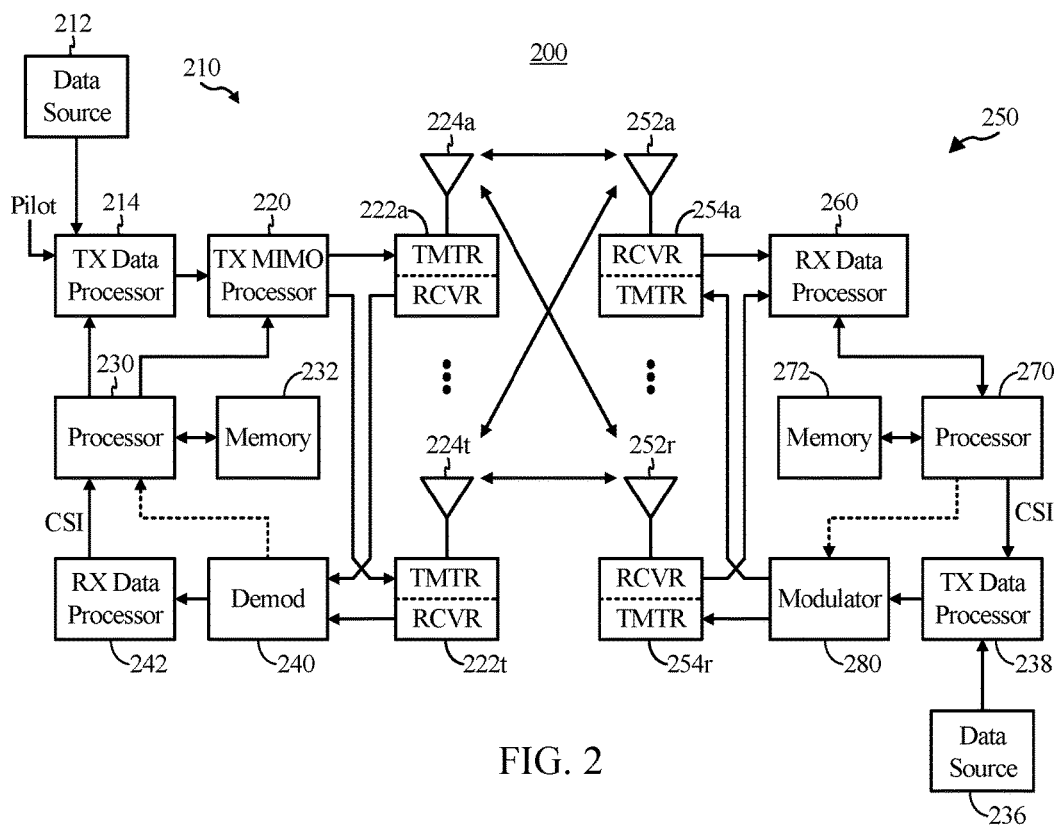
FIG. 2 illustrates a block diagram of an aspect of a transmitter system and a receiver system, according to certain aspects of the present disclosure.

FIG. 2 illustrates a block diagram of an aspect of a transmitter system 210 (e.g., also known as the base station) and a receiver system 250 (e.g., also known as the wireless node) in a multiple-input multiple-output (MIMO) system 200, in which aspects of the present disclosure may be practiced. Each of system 210 and system 250 has capabilities to both transmit and receive. Whether system 210 or system 250 is transmitting, receiving, or transmitting and receiving simultaneously depends on the application. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme (e.g., low-density parity check (LDPC)) selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (e.g., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230. Memory 232 may store data and software/firmware for the transmitter system 210.

The modulation symbols for all data streams are then provided to a TX MIMO processor 220, which may further process the modulation symbols (e.g., for OFDM). TX MIMO processor 220 then provides $N_T$ (e.g., where $N_T$ is a positive integer) modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals may be received by $N_R$ (e.g., where $N_R$ is a positive integer) antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

A receive (RX) data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software/firmware for the receiver system 250. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Any one of the processor 270, RX data processor 260, TX data processor 238, or other processors/elements, or a combination thereof of the receiver system 250 and/or any one of the processor 230, TX MIMO processor 220, TX data processor 214, RX data processor 242, or other processors/elements, or a combination thereof of the transmitter system 210 may be configured to perform the procedures for LDPC decoding in accordance with certain aspects of the present disclosure discussed below. In an aspect, at least one of the processor 270, RX data processor 260, and TX data processor 238 may be configured to execute algorithms stored in memory 272 for performing the procedure for LDPC decoding described herein. In another aspect, at least one of the processor 230, TX MIMO processor 220, TX data processor 214, and RX data processor 242 may be configured to execute algorithms stored in memory 232 for performing the procedures for LDPC decoding described herein.

Figure 3:
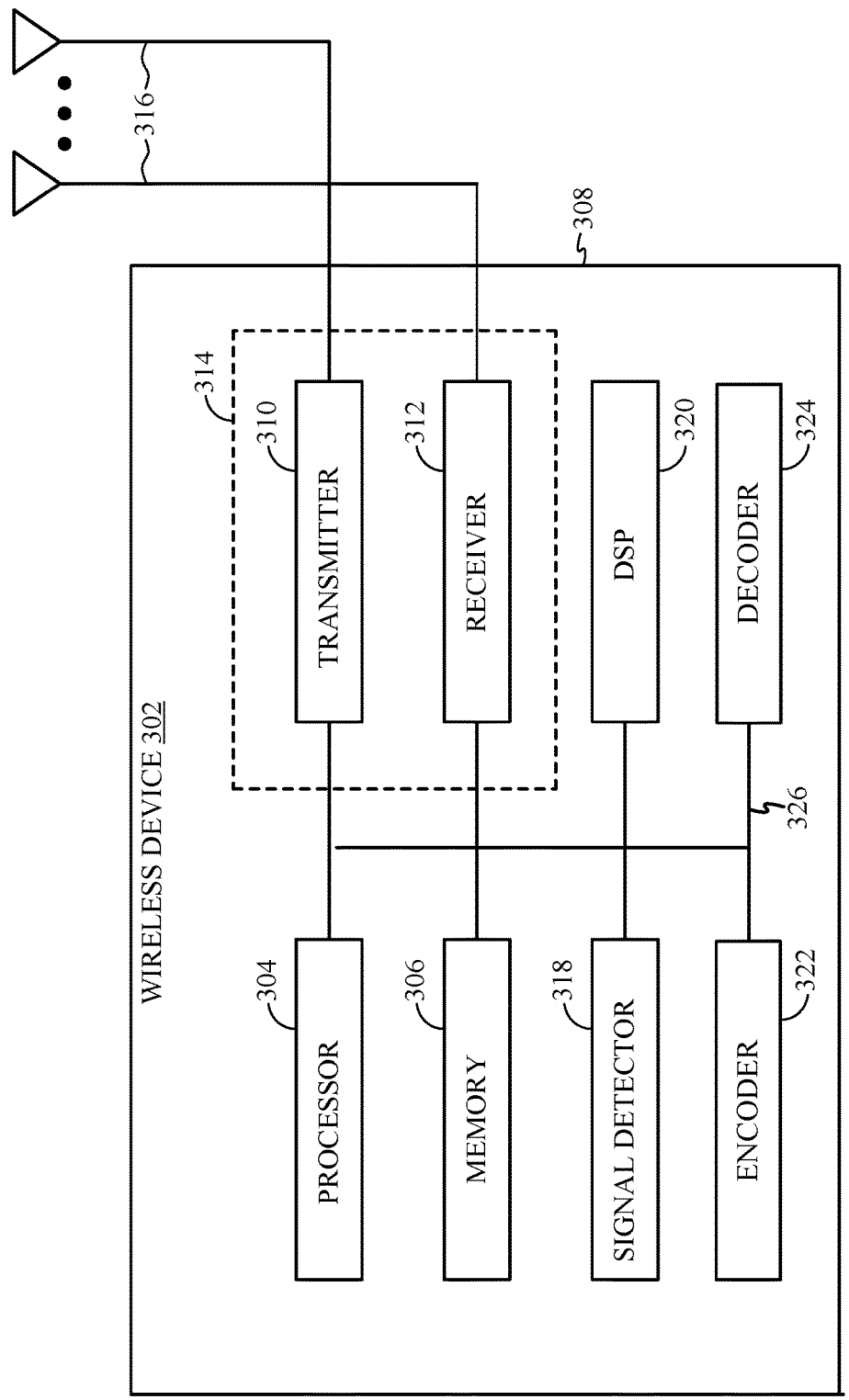
FIG. 3 illustrates various components that may be utilized in a wireless device, according to certain aspects of the present disclosure.

FIG. 3 illustrates various components that may be utilized in a wireless device 302 that may be employed within the wireless communication system 100 illustrated in FIG. 1. The wireless device 302 is an example of a device that may be configured to implement the various methods described herein. The wireless device 302 may be a Node B 102 (e.g., a TRP) or any of the wireless nodes (e.g., wireless nodes 116, 122, 130 or IoT device 136 or 142). For example, the wireless device 302 may be configured to perform operations 900 described in FIG. 9, as well as other operations described herein.

The wireless device 302 may include a processor 304 that controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein, for example, to allow a UE to decode LDPC codes. Some non-limiting examples of the processor 304 may include Snapdragon processor, application specific integrated circuits (ASICs), programmable logic, etc.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers. The wireless device 302 can also include wireless battery charging equipment.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the decoder 324 may perform decoding according to certain aspects presented herein (e.g., by implementing operations 900 illustrated in FIG. 9).

The various components of the wireless device 302 may be coupled together by a bus system 326, which may include a power bus, a control signal bus, and a status signal bus in addition to a data bus. The processor 304 may be configured to access instructions stored in the memory 306 to perform LDPC decoding, in accordance with aspects of the present disclosure discussed below.

Example Error Correction Coding

Many communications systems use error-correcting codes. Specifically, error correcting codes compensate for the intrinsic unreliability of information transfer in these systems by introducing redundancy into the data stream. Low density parity check (LDPC) codes are a particular type of error-correcting codes which use an iterative coding system. In particular, Gallager codes are an early example of regular LDPC codes. LDPC codes are linear block codes, which generally have a sparse parity check matrix H. For example, in some embodiments, most of the elements of its parity check matrix H are '0'.

LDPC codes can be represented by bipartite graphs (often referred to as "Tanner graphs"), wherein a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets and with edges connecting nodes of the two different types, variable and check.

A lifted graph is created by copying a bipartite base graph (G), which may also be known as a protograph, a number of times, Z. A variable node and a check node are considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the Z copies of G. A bit sequence having a one-to-one association with the variable node sequence is a valid code word if and only if, for each check node, the bits associated with all neighboring variable nodes sum to zero modulo two (i.e., they include an even number of 1's). The resulting LDPC code may be quasi-cyclic (QC) if the permutations used are cyclic.

Figures 4, 4A:
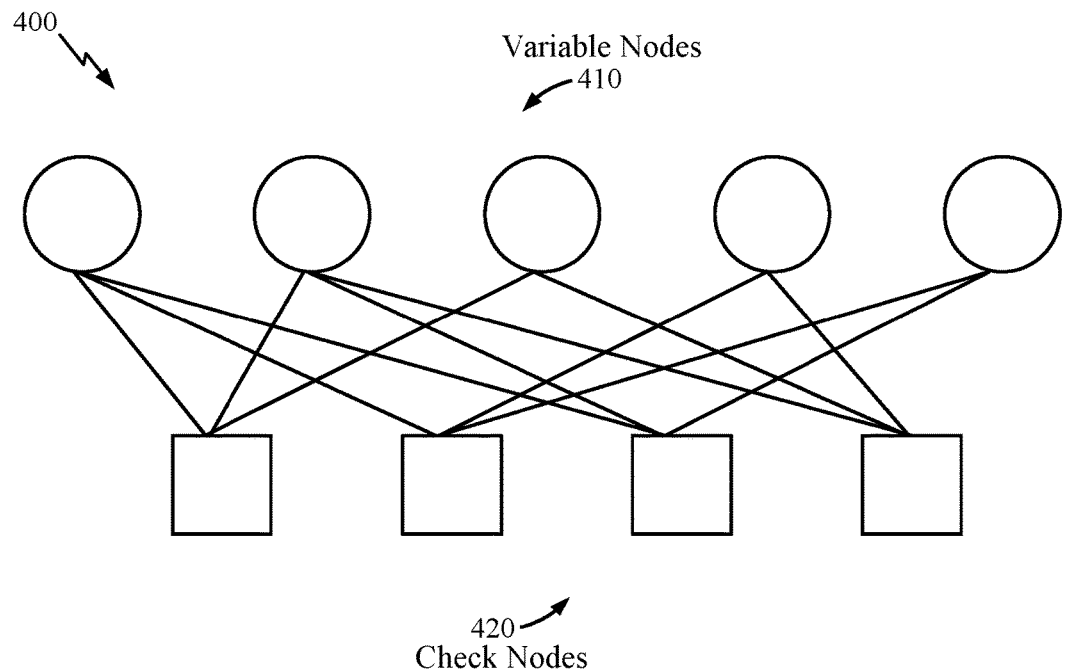
FIGS. 4 and 4A show graphical and matrix representations of an exemplary low density parity check (LDPC) code, according to certain aspects of the present disclosure.

FIGS. 4-4A show graphical and matrix representations of an exemplary LDPC code, in accordance with certain aspects of the present disclosure. For example, FIG. 4 shows a bipartite graph 400 representing an exemplary LDPC code. The bipartite graph 400 includes a set of 5 variable nodes 410 (represented by circles) connected to 4 check nodes 420 (represented by squares). Edges in the graph 400 connect variable nodes 410 to the check nodes 420 (represented by the lines connecting the variable nodes 410 to the check nodes 420). This graph consists of |V|=5 variable nodes and |C|=4 check nodes, connected by |E|=12 edges.

The bipartite graph may be represented by a simplified adjacency matrix, which may also be known as a parity check matrix. FIG. 4A shows a matrix representation 400A of the bipartite graph 400. The matrix representation 400A includes a parity check matrix H and a code word vector x, where $x_1$-$x_5$ represent bits of the code word x. The parity check matrix H is used for determining whether a received signal was normally decoded. The parity check matrix H has C rows corresponding to j check nodes and V columns corresponding to i variable nodes (i.e., a demodulated symbol), where the rows represent the equations and the columns represents the bits of the code word. In FIG. 4A, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the i-th column and in the j-th row of the parity check matrix H. That is, the intersection of an i-th row and a j-th column contains a "1" where an edge joins the corresponding vertices and a "0" where there is no edge. The code word vector x represents a valid code word if and only if Hx=0 (e.g., if, for each constraint node, the bits neighboring the constraint (via their association with variable nodes) sum to zero modulo two, i.e., they comprise an even number of ones). Thus, if the code word is received correctly, then Hx=0 (mod 2). The parity check matrix is a C row by V column binary matrix. The rows represent the equations and the columns represent the digits in the code word.

The number of demodulated symbols or variable nodes is the LDPC code length. The number of non-zero elements in a row (column) is defined as the row (column) weight dc (dv). In some aspects, such as for rate-compatible LDPC codes, not all variable nodes of the entire LDPC code are used for a code word as discussed herein. For example, a code word may be encoded/decoded using only a portion of the bipartite graph 400 and the code word may have a length that is less than the overall LDPC code length.

The degree of a node refers to the number of edges connected to that node. This feature is illustrated in the H matrix shown in FIG. 4A where the number of edges incident to a variable node 410 is equal to the number of 1's in the corresponding column and is called the variable node degree d(v). Similarly, the number of edges connected with a check node 420 is equal to the number of ones in a corresponding row and is called the check node degree d(c).

A regular graph or code is one for which all variable nodes have the same degree, j, and all constraint nodes have the same degree, k. In this case, we say that the code is a (j, k) regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit-columns and a number (N) of code bit columns. Lifting the base graph a number (Z) of results in a final block length of KZ.

Thus, a larger graph can be obtained by a "copy and permute" operation where multiple copies of the base graph are made and connected to form a single lifted graph. For the multiple copies, like edges that are a set of copies of a single base edge, are permutated and connected to form a connected graph Z times larger than the base graph.

Figure 5:
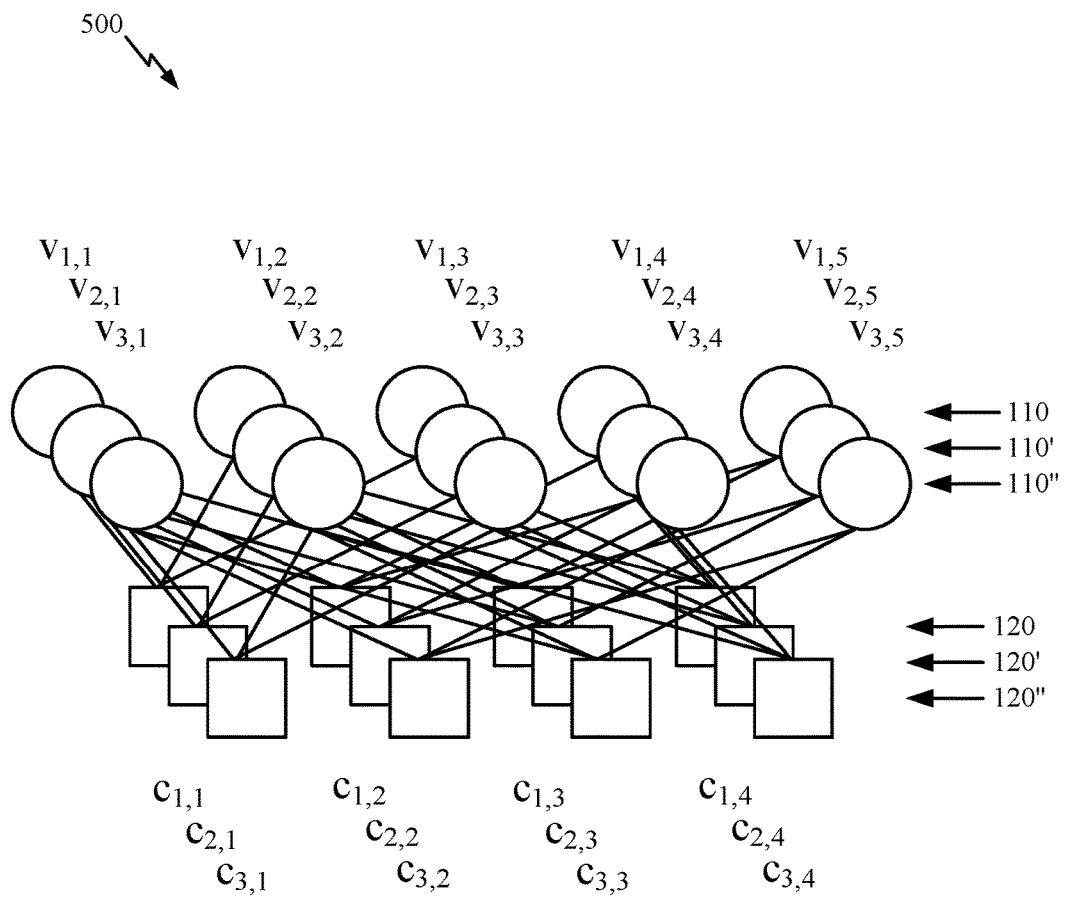
FIG. 5 graphically illustrates lifting of the LDPC code of FIG. 4A, according to certain aspects of the present disclosure.

FIG. 5 graphically illustrates the effect of making three copies of the graph of FIG. 4. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, we can apply the "copy and permute" operation to a base graph.

A corresponding parity check matrix of the lifted graph can be constructed from the parity check matrix of the base graph by replacing each entry in the base parity check matrix with a ZxZ matrix. The 0 entries (those having no base edges) are replaced with the 0 matrix and the 1 entries (indicating a base edge) are replaced with a ZxZ permutation matrix. In the case of cyclic liftings the permutations are cyclic permutations.

A cyclically lifted LDPC code can also be interpreted as a code over the ring of binary polynomials modulo $x^Z+1$. In this interpretation, a binary polynomial, $(x)=b_0+b_1\ x+b_2\ x^2+\ldots+b_{Z-1}\ x^{Z-1}$ may be associated to each variable node in the base graph. The binary vector $(b_0, b_1, b_2, \ldots b_{Z-1})$ corresponds to the bits associated to Z corresponding variable nodes in the lifted graph, that is, Z copies of a single base variable node. A cyclic permutation by k of the binary vector is achieved by multiplying the corresponding binary polynomial by $X^k$ where multiplication is taken modulo $x^Z+1$. A degree d parity check in the base graph can be interpreted as a linear constraint on the neighboring binary polynomials $B_1(x), \ldots, B_d(x)$ written as $x^{k_1}\ B_1(x)+x^{k_2}\ B_2(x)+\ldots+x^{k_d}\ B_d(x)=0$ where the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^Z+1$. Such a matrix may be written by giving the value k in place of $x^k$. In this case the 0 polynomial is sometimes represented as −1 and sometimes as another character in order to distinguish it from $x^0$.

Figure 6:
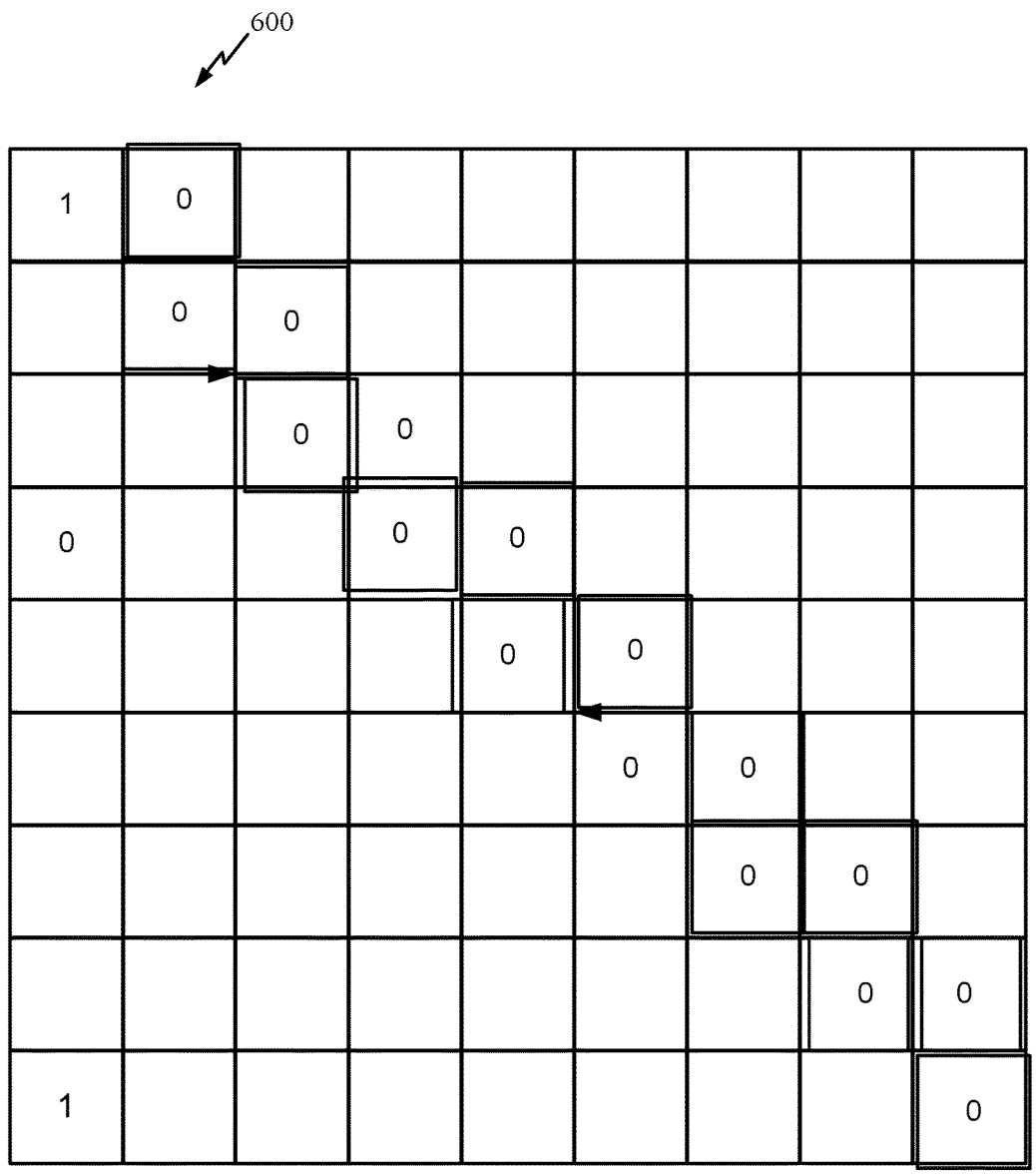
FIG. 6 is an integer representation of a matrix for a quasi-cyclic 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving Mc=s=Nd where c and d comprise x. In the case of quasi-cyclic codes, or cyclically lifted codes, the above algebra can be interpreted as being over the ring of binary polynomials modulo $x^Z+1$. In the case of the 802.11 LDPC codes, which are quasi-cyclic, the encoding submatrix M has an integer representation as shown in FIG. 6.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC code designs based on cyclic lifting can be interpreted as codes over the ring of polynomials modulo may be binary polynomials modulo $x^Z+1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

In certain aspects, protograph based codes, such as those described herein, are a subclass of a more general multi-edge type of LDPC code as discussed herein. Accordingly, certain aspects discussed herein may also apply to multi-edge LDPC codes.

In certain aspects, such as in certain wireless communication systems (e.g., NR systems), codes may need to be rate-compatible and thus provide for hybrid automatic repeat request (HARQ) re-transmissions. One way to obtain such a rate-compatible family of LDPC codes is to extend the high-rate core LDPC code by degree one parity bits. These parity bits may be referred to as HARQ parity bits, since in subsequent HARQ re-transmissions, a large portion of transmitted bits could be HARQ parity bits as further described herein. In certain aspects, these HARQ parity bits allow construction of native low-rate codes (e.g., used for a first transmission). In certain aspects described herein, these HARQ parity-bits are used to obtain a list decoder with enhanced performance.

Accordingly, in some aspects, rate-compatible LDPC code design may be utilized in such wireless communication systems to accommodate the different coding rates. In some aspects, such rate-compatible LDPC code design utilizes a high code rate LDPC code, which can then be extended to lower rates by adding extra parity bits to the LDPC code words. These extra parity bits may be used for a lower code rate for transmissions, or can be used as HARQ parity bits. For example, in some aspects a large mother code defines the LDPC codes at all code rates, and for any given code rate, the LDPC code used is obtained by selecting the appropriate number of parity bits to add to lower the code rate.

Figure 7:
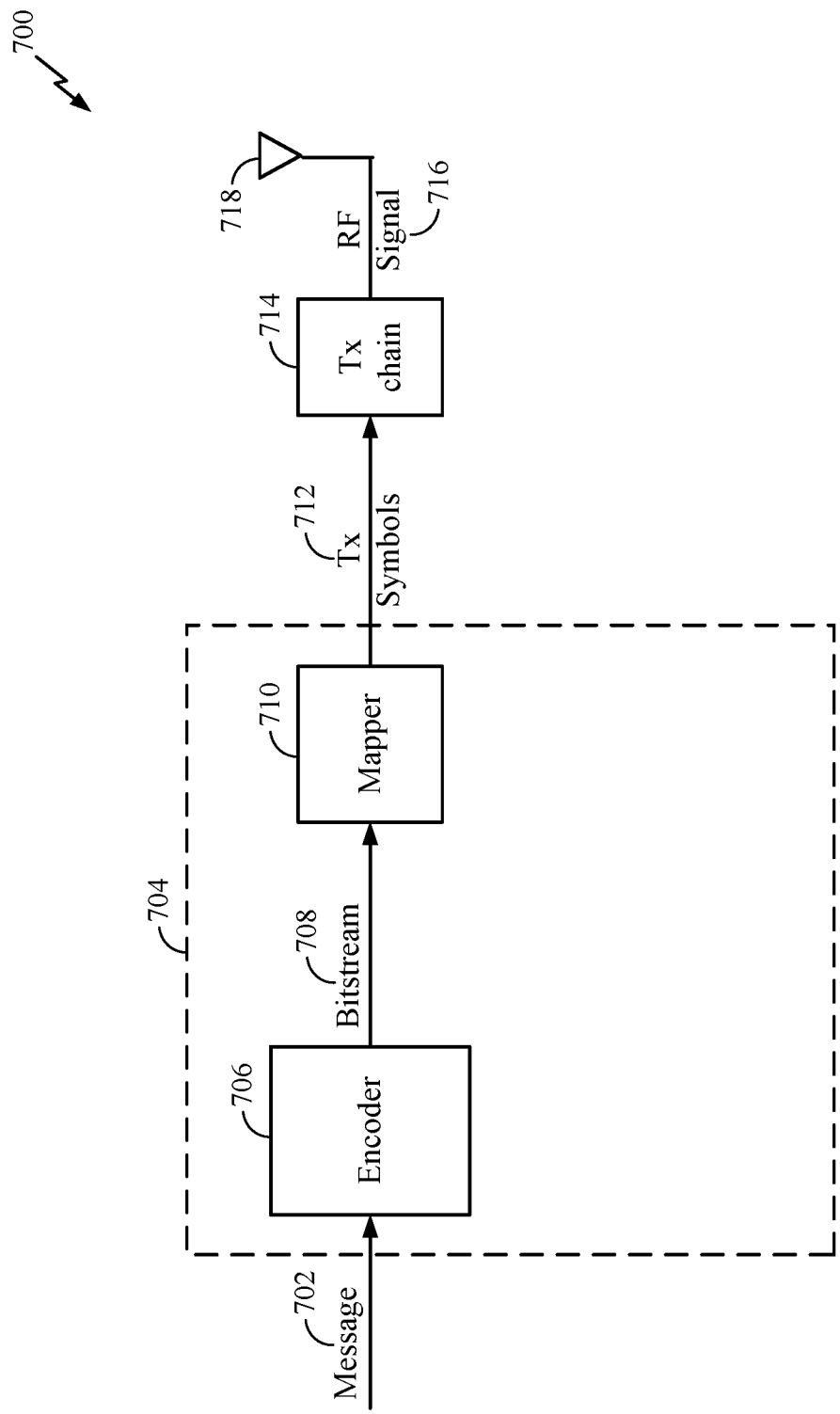
FIG. 7 is a simplified block diagram illustrating a portion of a radio frequency modem including an encoder, according to certain aspects of the present disclosure.

FIG. 7 illustrates a portion of a radio frequency (RF) modem 704 that may be configured to provide an encoded message for wireless transmission. In one example, an encoder 706 in a base station (e.g., Node B 102 and/or transmitter system 210) (or wireless node on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the base station or another network entity. In some cases, the encoder 706 may encode the message, for example, using techniques described herein (e.g., by using a LDPC code). An encoded bitstream 708 produced by the encoder 706 may then be provided to a mapper 710 that generates a sequence of Tx symbols 712 that are modulated, amplified and otherwise processed by Tx chain 714 to produce an RF signal 716 for transmission through antenna 718.

Figure 8:
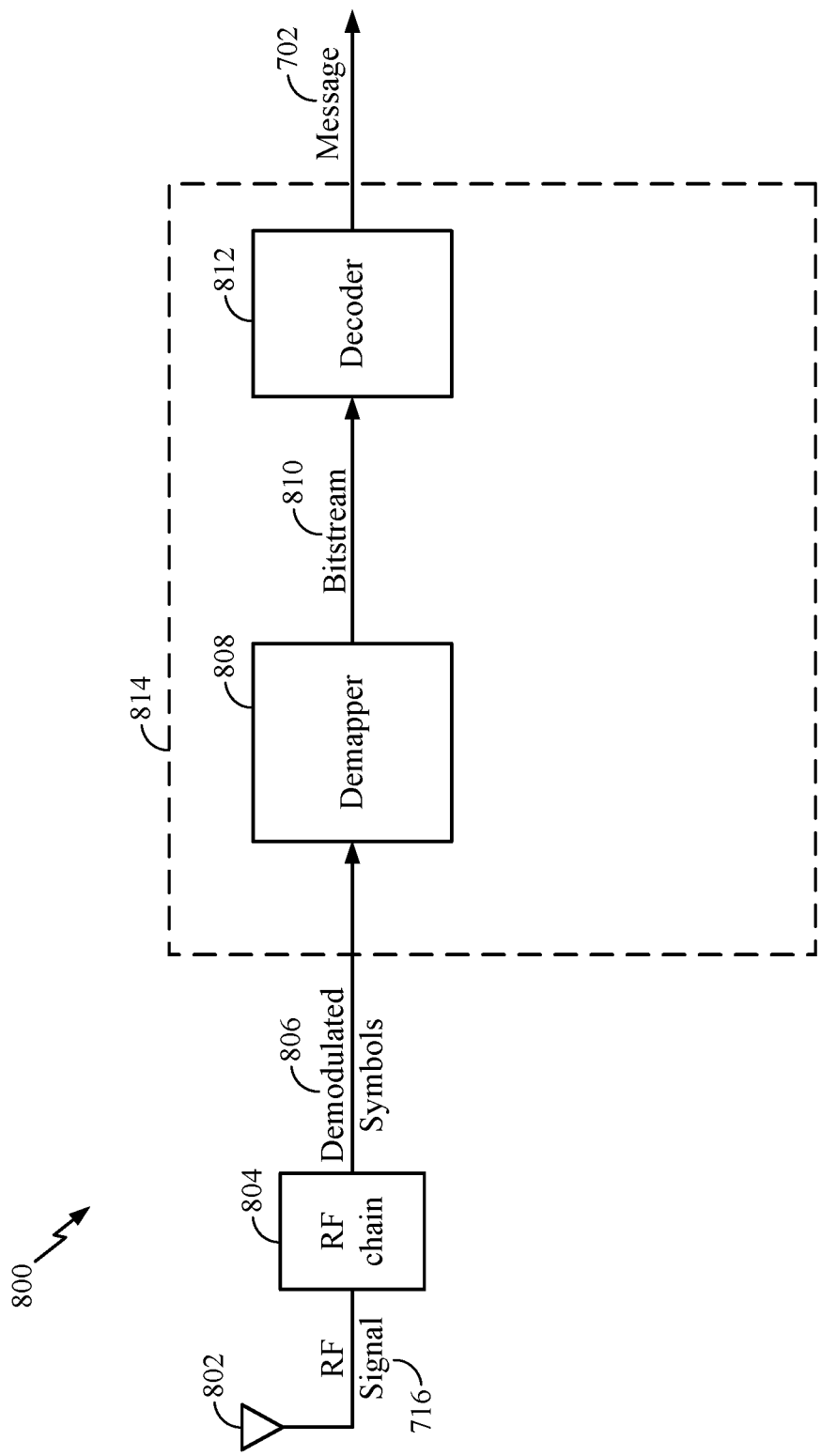
FIG. 8 is a simplified block diagram illustrating a portion of a radio frequency modem including a decoder, according to certain aspects of the present disclosure.

FIG. 8 illustrates a portion of a RF modem 814 that may be configured to receive and decode a wirelessly transmitted signal including an encoded message (e.g., a message encoded using a LDPC code as described herein). In various examples, the modem 814 receiving the signal may reside at the wireless node (e.g., wireless node 116, receiver system 250), at the base station (e.g., Node B 102, transmitter system 210), or at any other suitable apparatus or means for carrying out the described functions (e.g., wireless device 302). An antenna 802 receives an RF signal 716 (i.e., the RF signal 716 produced in FIG. 7) for a wireless node (e.g., wireless node 116, and/or receiver system 250). An RF chain 804 processes and demodulates the RF signal 716 and may provide a sequence of demodulated symbols 806 to a demapper 808, which produces a bitstream 810 representative of the encoded message.

A decoder 812 may then be used to decode m-bit information strings from a bitstream that has been encoded using a coding scheme (e.g., an LDPC code). The decoder 812 may comprise a layered LDPC decoder with a full-parallel, row-parallel, or block-parallel architecture. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with or receive a "soft bit" (e.g., representing the received bit of the code word) that indicates an estimate of the associated bit's value as determined by observations from the communications channel. The "soft bit" may be represented by a log-likelihood ratio (LLR) that in some aspects may be defined as the log((probability the bit is 0)/(probability the bit is 1)). Using these LLRs the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel. According to aspects, following these decoding techniques, the decoder 812 may decode the bitstream 810 based on the LLRs to determine the message 702 containing data and/or encoded voice or other content transmitted from the base station (e.g., Node B 102 and/or transmitter system 210). The decoder may decode the bitstream 810 in accordance with aspects of the present disclosure presented below (e.g., by implementing operations 900 illustrated in FIG. 9).

Example Efficient List Decoder for LDPC Codes

Low-density parity check (LDPC) is a powerful error correcting coding technology used in several applications such as wireless communications, storage and Ethernet. LDPC is based on designing codes on bipartite graphs, for example, as illustrated in FIG. 4. LDPC decoding is typically implemented using belief propagation techniques, described above, where messages are passed along edges of the graph and the nodes in the graph approximately compute their marginal distributions from which decisions on the source symbols can be made. In particular, in certain aspects, a belief propagation technique is implemented in an LDPC decoder (e.g., decoder 812). The LDPC decoder receives initial estimates of the values of bits of a LDPC code word represented as LLRs as determined by observations from the communications channel the code word is received on. These initial LLRs may be referred to as channel LLRs. The code word is iteratively decoded by the LDPC decoder using the belief propagation techniques to iteratively update the values of the LLRs. The LDPC decoder stops decoding and updating the LLRs after performing a threshold number of iterations or after terminating early (i.e., before performing the threshold number of iterations) based on meeting an early termination criteria (e.g., parity check for each row of a parity check matrix return true for a given iteration of LDPC decoding for the LLRs). The resulting output of the decoder represents the value of the transmitted LDPC code word, which then can be decoded to retrieve the information bits represented by the LDPC code word. The LDPC decoder may implement one of a number of different LDPC decoding algorithms to perform decoding of a LDPC code word as discussed.

In some aspects, an LDPC decoder, may utilize a message passing decoder algorithm such as a sum-product (SP) decoding algorithm, or variant thereof (e.g., an adjusted min-sum decoding algorithm), to decode LDPC code words, and may be referred to as a message passing decoder (e.g., a SP decoder). The message passing decoding algorithm and variants thereof are examples of message passing decoding algorithms as generally described herein that may be used by an LDPC decoder. Such message passing decoders (e.g., a belief-propagation decoder (e.g., sum-product decoder), a minsum decoder, an offset minsum decoder, a normalized minsum decoder, an adjusted minsum decoder, etc.) may perform well for large block lengths (e.g., number of bits of an LDPC code word), where information bits are encoded to form large code words. However, some wireless communication systems (e.g. NR) may use coding schemes with short block lengths (e.g., ~100s of bits) for coding information bits into smaller code words. In certain aspects, at shorter block lengths, message passing decoders may not operate efficiently (e.g., may suffer losses on the order of a dB or more) as compared to an optimal maximum-likelihood (ML) decoder that implements a ML decoding algorithm for decoding LDPC code words.

However, ML decoders in the worst case have exponential complexity with respect to block length, and therefore are not practical decoders to implement. Accordingly, in some aspects, list decoders are used as a quasi-ML decoder that have a lower complexity of implementation, but still provide reasonable performance. Therefore, in some aspects, the LDPC decoder is a list decoder. In a list decoder, the list decoder produces several candidate code words (unlike other message passing decoding algorithms that decode to a single code word) as the received LDPC code word based on the channel LLRs (e.g., using a message passing decoder algorithm of a message passing decoder, such as using belief propagation techniques, such as, an SP decoding algorithm, or variation thereof). The list decoder selects the candidate code word with the highest reliability metric (e.g., highest likelihood of observing the channel LLRs with respect to the code word, highest ML metric, etc.) as the resulting output of the decoder and the value of the received LDPC code word. If no candidate code words are generated by the list decoder, a failure is declared. In some aspects, it may be desirable to keep the number of candidate code words (e.g., list size) small (e.g., 16).

In some aspects, a list decoder generates candidate code words by generating candidate output messages based on the channel LLRs received that represent the bits of the code word. The list decoder generates candidate output messages by modifying the values of one or more channel LLRs to represent a certain 1 or certain 0 for the corresponding bit, and running a decoding algorithm (e.g., using a message passing decoder algorithm such as using belief propagation techniques, such as, an SP decoding algorithm, or variation thereof) to completion (e.g., maximum number of iterations or early termination). For example, the list decoder sorts the channel LLRs of the codebits received over the communication channel, from least channel reliability (i.e., lowest magnitude, e.g., 0) to highest channel reliability (i.e., highest magnitude dependent on implementation). For S (where S is a positive integer, e.g., 4) channel LLRs having the least channel reliability, the list decoder sets the values of those bits represented by the S channel LLRs to every possible combination of certain values for the bits. Each bit can have one of two values, either 1 or 0. Accordingly, there are $2^S$ possible combinations of values for the bits represented by the S channel LLRs. For example, for S=2, the values are {00, 01, 10, and 11}.

Accordingly, $2^S$ sets of channel LLR values are generated, where for each set, the S channel LLRs are set to a different value of the $2^S$ possible combinations of values. Each set of channel LLRs still has the same number of channel LLRs as the initial channel LLRs received that represent the bits of the code word. In particular, each of the S channel LLRs are set to one of a maximum negative or positive LLR value (i.e., maximum value based on the number of bits used to represent the LLR used in the list decoder) that represents the certain 1 or 0 of the corresponding bit. The remaining channel LLRs (other than the S channel LLRs) keep the value based on the observations from the communication channel. Each of the $2^S$ sets of channel LLR values are then used as input to the decoding algorithm which could be just a message passing algorithm such as the standard SP or any of its variants, resulting in $2^S$ corresponding candidate output messages (e.g., sets of updated LLR values). Note that only one of the configurations of 0s and 1s on the S parity-bits is actually correct. This is because the information bits give rise to a unique configuration of 0s and is on the S parity-bits. The hope is that the correct configuration of 0s and 1s on S parity-bits will give rise to S new parity-check constraints on the code resulting in improved performance for that configuration of 0s and is on S. The reliability metric or any other CRC test would perhaps not work for the remaining incorrect configurations on these S parity-bits.

In some aspects, not every generated output message is necessarily a code word (e.g., code words may correspond to a finite set of possible bit values). Accordingly, in some aspects, only candidate output messages that are code words are selected as candidate code words by the list decoder. Further, in some aspects, a cyclic redundancy check (CRC) is added to the LDPC code words to improve decoding performance of the list decoder by rejecting candidate output messages that do not satisfy the CRC. Such aspects can be used with any appropriate list decoder, such as those described herein. The CRC is therefore another parameter like the reliability metric for selecting a candidate code word as the resulting output of the decoder.

The list decoder, from the candidate code words, selects the candidate code word with the highest reliability metric (e.g., highest likelihood of observing the channel LLRs with respect to the code word, highest ML metric, etc.) as the resulting output of the decoder and the value of the received LDPC code word.

As discussed, in some aspects, the channel LLRs set to certain values in the list decoder are those channel LLRs with the least channel reliability. In order to determine which channel LLRs have the least channel reliability, a sorting process needs to be performed on the channel LLRs, which may necessitate the use of additional hardware (e.g., silicon space) and computational cost (e.g., time, power, etc.) to implement the sorting mechanism. Further, for higher coding rates, the signal-to-noise ratio (SNR) of received signals is usually higher, and therefore the channel LLR values usually have higher channel reliability values. Therefore, throwing away such channel LLR values with higher channel reliability may hurt performance of the list decoder. In particular, removing the least reliable channel LLRs could still lead to removing good information that could have been used for better performance of the list decoder.

Accordingly, certain aspects described herein provide an efficient list decoder that does not require the overhead of a sorting process, and further does not throw away potentially high channel reliability value channel LLRs (e.g., for higher coding rates). Such an efficient list decoder may take less silicon space and hardware to implement than other list decoders, and further operate more efficiently, such as decoding LDPC code words more quickly. In some aspects, an LDPC decoder may utilize the list decoding techniques described herein to perform LDPC decoding for block lengths below a threshold block length, and may use other decoding techniques (e.g., a message passing decoder algorithm such as SP decoding or variants thereof) for block lengths above the threshold, such as to utilize more efficient decoding techniques for various block lengths.

Some wireless communication systems (e.g. NR) may need to operate at several different coding rates, such as to support hybrid automatic repeat request (HARQ). In ARQ, redundant bits are added to transmitted data in a message using an error-detecting (ED) code such as a CRC. Receivers of the message determine if the received data is corrupted based on the ED code and request a new message if the data is corrupted. In HARQ, the data is encoded using a forward error correction (FEC) code, and parity bits are sent along with the data, or transmitted separately if a receiver detects an error with the received message. In incremental redundancy HARQ, the number of parity bits used for each subsequent transmission may change to get the efficiency gains of HARQ, and therefore the code rate of the data transmission may change.

Accordingly, in some aspects, rate-compatible LDPC code design may be utilized in such wireless communication systems to accommodate the different coding rates. In some aspects, such rate-compatible LDPC code design utilizes a high code rate LDPC code (e.g., 8/9 code rate, where 8 information bits are represented by 9 bits in a code word), which can then be extended to lower rates (e.g., fewer information bits per bits in a code word) by adding extra parity bits to the LDPC code words. These extra parity bits may be used for a lower code rate for transmissions, or can be used as HARQ parity bits. For example, in some aspects a large mother code (e.g., large bipartite graph) defines the LDPC codes at all code rates, and for any given code rate, the LDPC code used is obtained by selecting the appropriate number of parity bits to add to lower the code rate. For example, a code word may be generated using only a portion of the large mother code (e.g., only a portion of a large bipartite graph), and therefore have a shorter block length (i.e., fewer number of bits) than defined by the larger mother code. These extra bits of the large mother code not used for generating the code word may be the extra parity bits. The extra parity bits, whether used for HARQ or to lower code rates for transmissions may still form an LDPC code. In certain aspects, degree one extensions of the base bipartite graph are described, however, degree 2 extensions of the bipartite graph are also possible.

In certain aspects, a list decoder as described herein may take advantage of such rate-compatible LDPC code designs to more efficiently decode LDPC code words. In particular, in some aspects as discussed above, for S (where S is a positive integer, e.g., 4) channel LLRs having the least channel reliability, the list decoder sets the values of those bits represented by the S channel LLRs to every possible combination of certain values for the bits. In some aspects, instead of setting the S channel LLRs with the least channel reliability to every possible combination of certain values for the bit, the list decoder additionally uses S parity bits from the rate-compatible LDPC code to essentially extend the code word and generates LLRs corresponding to the S parity bits having every possible combination of certain values for the bits. In certain aspects, these additional S parity bits are not received from the transmitter, but rather are selected based on the rate-compatible LDPC code design used to encode/decode the LDPC code word. Therefore, the list decoder selects these S parity bits based on the rate-compatible LDPC code design.

In some aspects, bits are encoded using a rate compatible LDPC code to generate a code word C that is transmitted from a transmitter (e.g., Node B 110, base station 210, UE 116, UE 250, and/or wireless device 302) to a receiver (e.g., Node B 110, base station 210, UE 116, UE 250, and/or wireless device 302). The code word C may have a first block length that is below a threshold block length size for using a list decoder as described herein. At the receiver, the LDPC decoder (e.g., decoder 812) runs a message passing decoder algorithm such as a belief propagation algorithm (e.g., SP decoding algorithm or a variant thereof) on the channel LLRs corresponding to the code word C, either until an early termination or maximum number of iterations have completed. If the corresponding output of the LDPC decoder is a code word (e.g., all parity checks for the code word are satisfied), then decoding stops and the code word is used as the result of the LDPC decoder.

However, if the corresponding output of the LDPC decoder is not a code word, the LDPC decoder selects S parity bits from the rate-compatible code design to the code word C to extend the code word C to a lower code rate. For example, the code word C may be generated using a rate-compatible LDPC code design. The code word C may have a block length (i.e., number of bits) that is fewer than the number of bits defined by the rate-compatible LDPC code design (e.g., defined by a mother code). The LDPC decoder, therefore, can extend the number of bits used to represent code word C with S-parity bits, so that when performing LDPC decoding, a larger portion of a parity check matrix corresponding to the rate-compatible LDPC code design is used to decode the extended code word than used to decode the original code word C, to increase decoding efficiency.

In particular, to extend the code word C using the selected S parity bits (e.g., HARQ parity bits), as discussed, the LDPC decoder generates $2^S$ sets of LLR values, where for each set, the LLRs of the S parity bits are set to a different value of the $2^S$ possible combinations of values for the S parity bits (i.e., one of a maximum negative or positive LLR value for each parity bit), and the LLRs of the remaining bits of the code word are set to the channel LLR values. Accordingly, the number of LLRs representing the code word C is increased, as the code word C has essentially been extended by inclusion of LLRs corresponding to the S parity bits in addition to the initial channel LLR values. Each of the $2^S$ sets of LLR values are then used as input to the decoding algorithm (e.g., a message passing decoder algorithm such as SP decoding algorithm or a variant thereof), resulting in $2^S$ corresponding candidate output messages (e.g., sets of updated LLR values). In some aspects, two or more (e.g., all) of the $2^S$ corresponding candidate output messages are generated in parallel by running the decoding algorithm in parallel for the $2^S$ sets of LLR values. The candidate output message that is a code word and has the highest reliability metric (e.g., highest likelihood of observing the channel LLRs with respect to the code word, highest ML metric, etc.) as the resulting output of the LDPC decoder and the value of the received LDPC code word, plus the additional parity bits. The LDPC decoder may then take the resulting extended code word and decode the extended code word to retrieve the encoded information bits, where the extended code word has a lower encoding rate.

Figure 9:
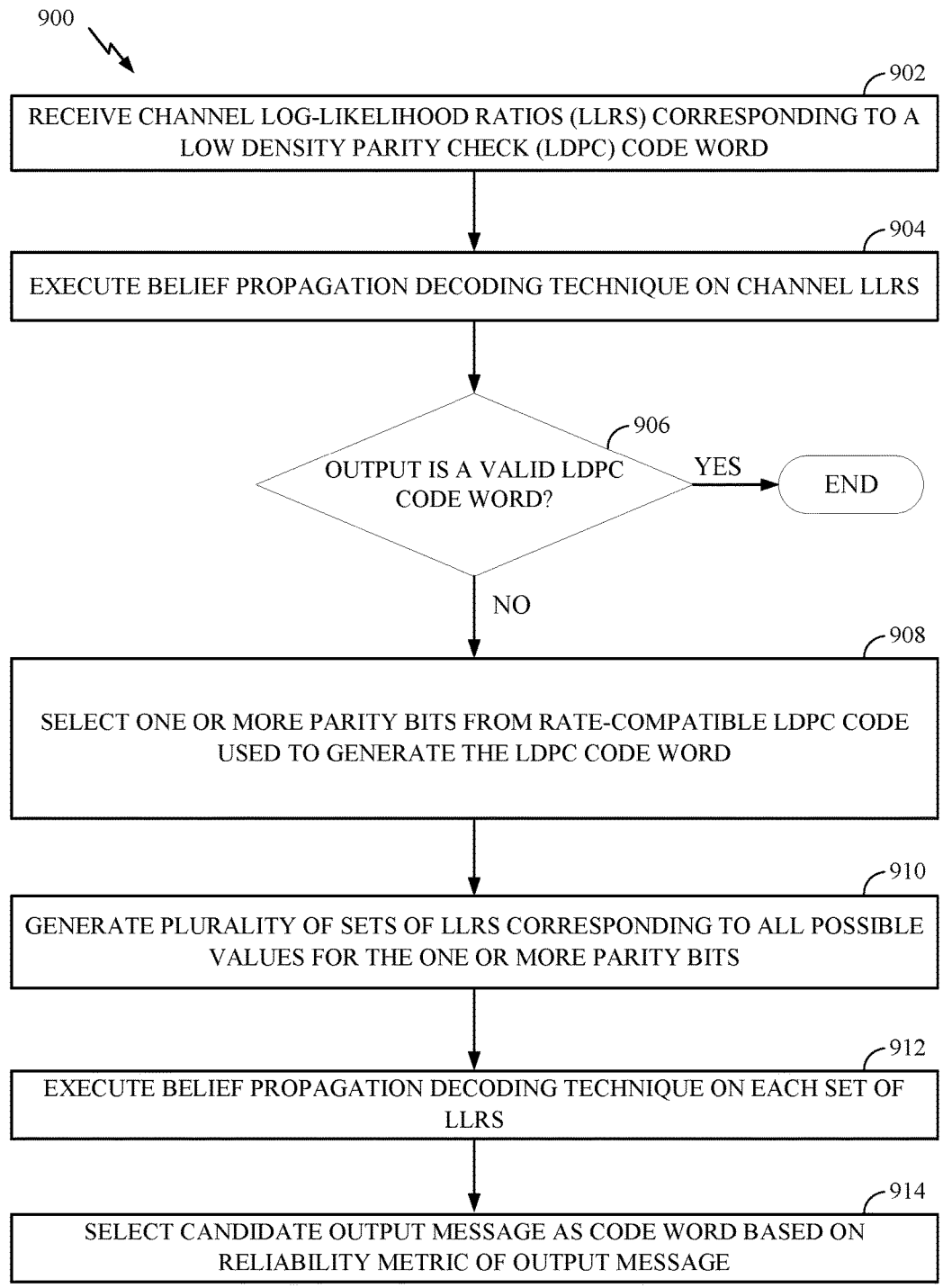
FIG. 9 illustrates example operations for performing low-density parity check (LDPC) decoding, according to certain aspects of the present disclosure.

FIG. 9 illustrates example operations 900 for performing low-density parity check (LDPC) decoding, according to certain aspects of the present disclosure. Operations may be performed by a decoder (e.g., decoder 800) in a wireless communications device, such as a base station (e.g., Node B 90 and/or base station 210), a user equipment (e.g., UE 96 and/or UE 250), and/or wireless device 302.

Operations 900 begin at 902 by receiving channel LLRs corresponding to a LDPC code word. At 904, the decoder executes a belief propagation decoding technique on the received channel LLRs to completion (e.g., maximum number of iterations or early termination). At 906, the decoder determines if the output of the belief propagation decoding technique is a valid LDPC code word. For example, the decoder determines if all the parity checks of a parity check matrix pass for the output. If at 906, the decoder determines the output is a valid LDPC code word, the output is used as the received LDPC code word and the process ends.

If at 906, the decoder determines the output is not a valid LDPC code word, the process continues to 908. At 908, the decoder selects one or more parity bits from the rate-compatible LDPC code used to generate the LDPC code word. At 910, the decoder generates a plurality of sets of LLRs corresponding to all possible combinations of values for the one or more parity bits, where each set of LLRs includes the channel LLRs and LLRs corresponding to a combination of values for the one or more parity bits. At 912, the decoder executes a belief propagation decoding technique (e.g., in parallel) on each of the sets of LLRs to completion to generate candidate output messages. At 914, the decoder selects a candidate output message that is a valid code word (e.g., based on the CRC) and has the highest reliability metric (e.g., if there is more than one valid code word) as the received LDPC code word and the process ends.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for computing, means for determining, means for using (e.g., processor and memory partitions), means for selecting, means for deactivating, and/or means for decoding may comprise a processing system including one or more processors, such as processor 230 and/or RX Data Processor 242 of the base station 210 and/or the processor 270 and/or RX Data Processor 260 of the user terminal 250. Additionally, means for receiving may comprise a receiver and/or antenna, such as the receiver 222 and/or antenna 224 of the base station 210 and/or the receiver 254 and/or antenna 252 of the user terminal 250.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for performing low-density parity-check (LDPC) decoding at a wireless device, the method comprising:

receiving a plurality of log-likelihood ratios (LLRs) corresponding to bits of a code word;

selecting, by a decoder of the wireless device, one or more parity bits to extend the code word;

generating a plurality of sets of LLRs corresponding to all possible combinations of values for the one or more parity bits, each of the plurality of sets of LLRs including the plurality of LLRs corresponding to the bits of the code word;

decoding, by the decoder of the wireless device, each of the plurality of sets of LLRs with a decoding algorithm to generate a corresponding plurality of candidate messages; and selecting one of the plurality of candidate messages as corresponding to the code word based on a parameter associated with the selected candidate message.

2. The method of claim 1, wherein the one or more parity bits correspond to a rate-compatible LDPC design used for generating the code word.

3. The method of claim 1, further comprising:

receiving a second code word;

determining if a block length of a second code word is above a threshold;

decoding the second code word with the decoding algorithm without generating a second plurality of candidate messages corresponding to the second code word when the block length of the second code word is above the threshold; and decoding the second code word with the decoding algorithm used to decode the code word by generating the second plurality of candidate messages corresponding to the second code word when the block length of the second code word is below the threshold.

4. The method of claim 3, wherein the decoding algorithm comprises at least one of a belief-propagation decoder, a sum-product decoder, a minsum decoder, an offset minsum decoder, a normalized minsum decoder, or an adjusted minsum decoder.

5. The method of claim 1, wherein the plurality of log-likelihood ratios are determined based on signals received over a communications channel.

6. The method of claim 1, wherein decoding each of the plurality of sets of LLRs is performed in parallel.

7. The method of claim 1, further comprising:

determining whether each candidate message of the plurality of candidate messages is a valid code word, wherein selecting one of the plurality of candidate messages as corresponding to the code word is further based on whether the one of the plurality of candidate messages is a valid code word.

8. The method of claim 1, wherein the one or more parity bits correspond to hybrid automatic repeat request bits.

9. The method of claim 1, wherein the decoding algorithm comprises utilizing a message passing decoder.

10. The method of claim 1, wherein:

the decoding algorithm is a message passing decoding algorithm, and the method further comprises:

determining that a candidate message of the plurality of candidate messages is a valid code word; and ending decoding based on the determination of the valid code word.

11. The method of claim 1, wherein the parameter comprises a cyclic redundancy check.

12. The method of claim 1, wherein the parameter comprises a reliability metric.

13. The method of claim 12, wherein the reliability metric comprises a maximum-likelihood metric.

14. The method of claim 1, wherein for each of the plurality of sets of LLRs, LLRs corresponding to the one or more parity bits are each set to a maximum magnitude value.

15. The method of claim 1, wherein the one or more parity bits are locally selected by the decoder of the wireless device based on a rate-compatible LDPC design used for generating the code word, and not received from a transmitter of the code word.

16. An apparatus for performing low-density parity-check (LDPC) decoding, the apparatus comprising:
a memory;
a decoder; and
a processor, the memory, decoder, and processor being configured to:
receive a plurality of log-likelihood ratios (LLRs) corresponding to bits of a code word;
select, by the decoder, one or more parity bits to extend the code word;
generate a plurality of sets of LLRs corresponding to all possible combinations of values for the one or more parity bits, each of the plurality of sets of LLRs including the plurality of LLRs corresponding to the bits of the code word;
decode, by the decoder each of the plurality of sets of LLRs with a decoding algorithm to generate a corresponding plurality of candidate messages; and
select one of the plurality of candidate messages as corresponding to the code word based on a parameter associated with the selected candidate message.

17. The apparatus of claim 16, wherein the one or more parity bits correspond to a rate-compatible LDPC design used for generating the code word.

18. The apparatus of claim 16, wherein the memory and processor are further configured to:
receive a second code word;
determine if a block length of a second code word is above a threshold;
decode the second code word with the decoding algorithm without generating a second plurality of candidate messages corresponding to the second code word when the block length of the second code word is above the threshold; and
decode the second code word with the decoding algorithm used to decode the code word by generating the second plurality of candidate messages corresponding to the second code word when the block length of the second code word is below the threshold.

19. The apparatus of claim 18, wherein the decoding algorithm comprises at least one of a belief-propagation decoder, a sum-product decoder, a minsum decoder, an offset minsum decoder, a normalized minsum decoder, or an adjusted minsum decoder.

20. The apparatus of claim 16, wherein the memory and processor are further configured to:
determine whether each candidate message of the plurality of candidate messages is a valid code word,
wherein to select one of the plurality of candidate messages as corresponding to the code word is further based on whether the one of the plurality of candidate messages is the valid code word.

21. The apparatus of claim 16, wherein the decoding algorithm comprises to utilize a message passing decoder.

22. The apparatus of claim 16, wherein:
the decoding algorithm is a message passing decoding algorithm,
the memory and processor are further configured to:
determine that a candidate messages of the plurality of candidate messages is a valid code word; and
end decoding abased on the determination of the valid code word.

23. The apparatus of claim 16, wherein the parameter comprises a cyclic redundancy check.

24. The apparatus of claim 16, wherein the parameter comprises a reliability metric.

25. The apparatus of claim 24, wherein the reliability metric comprises a maximum-likelihood metric.

26. The apparatus of claim 16, wherein for each of the plurality of sets of LLRs, LLRs corresponding to the one or more parity bits are each set to a maximum magnitude value.

27. The apparatus of claim 16, wherein the one or more parity bits are locally selected by the decoder based on a rate-compatible LDPC design used for generating the code word, and not received from a transmitter of the code word.

28. An apparatus for performing low-density parity-check (LDPC) decoding at a wireless device, the apparatus comprising:
means for receiving a plurality of log-likelihood ratios (LLRs) corresponding to bits of a code word;
means for selecting one or more parity bits to extend the code word;
means for generating a plurality of sets of LLRs corresponding to all possible combinations of values for the one or more parity bits, each of the plurality of sets of LLRs including the plurality of LLRs corresponding to the bits of the code word;
means for decoding each of the plurality of sets of LLRs with a decoding algorithm to generate a corresponding plurality of candidate messages; and
means for selecting one of the plurality of candidate messages as corresponding to the code word based on a parameter associated with the selected candidate message.

29. The apparatus of claim 28, wherein the one or more parity bits correspond to a rate-compatible LDPC design used for generating the code word.

30. The apparatus of claim 28, further comprising:
means for receiving a second code word;
means for determining if a block length of a second code word is above a threshold;
decoding the second code word utilizing a message passing decoder without generating a second plurality of candidate messages corresponding to the second code word when the block length of the second code word is above the threshold; and
decoding the second code word using the decoding algorithm used to decode the code word by generating the second plurality of candidate messages corresponding to the second code word when the block length of the second code word is below the threshold.

31. A non-transitory computer-readable medium having instructions stored thereon for performing a method for low-density parity-check (LDPC) decoding at a wireless device, the method comprising:
receiving a plurality of log-likelihood ratios (LLRs) corresponding to bits of a code word;
selecting, by a decoder of the wireless device, one or more parity bits to extend the code word;
generating a plurality of sets of LLRs corresponding to all possible combinations of values for the one or more parity bits, each of the plurality of sets of LLRs including the plurality of LLRs corresponding to the bits of the code word;
decoding, by the decoder of the wireless device, each of the plurality of sets of LLRs with a decoding algorithm to generate a corresponding plurality of candidate messages; and
selecting one of the plurality of candidate messages as corresponding to the code word based on a parameter associated with the selected candidate message.

32. The non-transitory computer-readable medium of claim 31, wherein the method further comprises:
- receiving a second code word;
- determining if a block length of a second code word is above a threshold;
- decoding the second code word with the decoding algorithm without generating a second plurality of candidate messages corresponding to the second code word when the block length of the second code word is above the threshold; and
- decoding the second code word with the decoding algorithm used to decode the code word by generating the second plurality of candidate messages corresponding to the second code word when the block length of the second code word is below the threshold.

* * * * *